(12) United States Patent
Ostmeier (10) Patent No.: US 9,797,952 B2
(45) Date of Patent: Oct. 24, 2017

(54) SAFETY TEST SWITCH WITH ACTUATION LEVER

(71) Applicant: Hubert Ostmeier, Alexandria, VA (US)

(72) Inventor: Hubert Ostmeier, Alexandria, VA (US)

( * ) Notice: Subject to any disclaimer, the term of this patent is extended or adjusted under 35 U.S.C. 154(b) by 79 days.

(21) Appl. No.: 14/880,460

(22) Filed: Oct. 12, 2015

(65) Prior Publication Data

US 2016/0291058 A1  Oct. 6, 2016

Related U.S. Application Data

(60) Provisional application No. 62/062,928, filed on Oct. 12, 2014.

(51) Int. Cl.
*G01R 31/327* (2006.01)
*H01R 13/703* (2006.01)

(52) U.S. Cl.
CPC ..... *G01R 31/3272* (2013.01); *H01R 13/7034* (2013.01)

(58) Field of Classification Search
USPC ... 324/126, 756.01–756.02, 750.3, 418, 538, 324/724, 750.01, 754.02, 754.03, 755.01, 324/755.05; 439/61, 62, 188; 340/635, 340/656
See application file for complete search history.

(56) References Cited

U.S. PATENT DOCUMENTS

| | | | | |
|---|---|---|---|---|
| 8,007,312 B2* | 8/2011 | Bower | ................. | H01R 13/514 439/540.1 |
| 2005/0250376 A1* | 11/2005 | Ostmeier | ............. | G01R 1/0416 439/521 |
| 2008/0106266 A1* | 5/2008 | Diessel | ................ | H01R 9/2616 324/415 |
| 2011/0089961 A1* | 4/2011 | Ostmeier | ............... | G01R 15/14 324/754.03 |

* cited by examiner

*Primary Examiner* — Melissa Koval
*Assistant Examiner* — Nasima Monsur
(74) *Attorney, Agent, or Firm* — Von Rohrscheldt Patents (57) ABSTRACT

An interface test device for testing a circuit, the interface test device including a module assembly including a plurality of modules, wherein a test block assembly is formed from individual test blocks that are arranged at one another in parallel and fixated at one another, wherein a test plug assembly is formed from individual test plugs that are arranged at one another other in parallel and fixated at one another, wherein a movement of a lever arm out of a plane of an insertion direction of the test plug assembly into the test block assembly is transferred by strut elements to pinions of the test plug assembly and inserts test fingers of the test plug assembly into openings of the test block assembly, wherein one of the test fingers of the test plug assembly opens a medium to high voltage monitoring circuit.

6 Claims, 8 Drawing Sheets

SAFETY TEST SWITCH WITH ACTUATION LEVER

RELATED APPLICATIONS

This application claims priority from and incorporates by reference U.S. Provisional Patent Application No. 62/062,928 filed on Oct. 12, 2014.

FIELD OF INVENTION

The present invention relates generally to an interface test device and method that opens a medium to high voltage circuit, and more specifically to an interface test device that opens a medium to high voltage monitoring circuit where the interface test device is configured to prevent accidental damage to the medium to high voltage monitoring circuit during maintenance and/or allows for maintenance of certain components without taking the medium to high voltage monitoring circuit off line.

BACKGROUND OF THE INVENTION

Most of the components of power system generation, transmission or distribution facilities, such as transmission lines, step-up and step-down transformers, power breakers and generators are monitored and controlled. The control and monitoring is usually performed by electromechanical or electronic equipment that are able to measure electrical quantities, perform calculations based on pre-defined algorithms and thresholds and actuate the system when necessary. Due to the high voltage, current and power flowing through the high-power components, current transformers, potential transformers and breakers are employed as an interface between the high-power components and the low-power control and monitoring devices such as a medium to high voltage monitoring circuit. This medium to high voltage monitoring circuit and its associated circuitry are tested by technicians. For example, a technician might test the operation of a medium to high voltage monitoring circuit or its associated circuitry by inserting a disconnect plug into an interface test device and performing various tests. Unfortunately, it is inevitable that mistakes happen during such testing which results in damage to the equipment or harm to the technician. During such testing, the technician might also adjust the medium to high voltage monitoring circuit by changing the parameters of the medium to high voltage monitoring circuit based upon the testing or based upon other factors. Unfortunately, such testing and adjustments take substantial amounts of the technician's time which is expensive. Furthermore, it is typical to perform period maintenance on the circuitry of the medium to high voltage monitoring circuits. In order to perform maintenance on medium to high voltage monitoring circuits, the associated power circuits must be powered down to allow the technician to perform the maintenance since the interface or other components in the medium to high voltage monitoring circuit might otherwise be damaged. These interruptions in operation of the medium to high voltage monitoring circuit and in the power circuit increase the cost of operation. For example, there are costs associated with switching to another power circuit and there are costs associated with the lost usage of the equipment powered by the power circuit. Accordingly, there is a strong need in the art to improve medium to high voltage monitoring circuits and their associated circuitries to reduce or eliminate the aforementioned drawbacks. Several different types of test interfaces are known in the power industry.

Test interfaces to be used for testing of substation devices can be inconvenient or cumbersome to activate due to problems of manually disconnecting the monitoring circuits from the system lines to the devices. One version of said interface works with a test plug to be inserted into a test block. Said test plug can be particularly difficult to insert, if it consists of many modules, i.e. covers many poles, which need to be inserted simultaneously. To aid in the insertion process of the plug, the current invention provides a leverage mechanism which is incorporated into the plug and renders possible a particularly smooth insertion of easy motion. In addition, a fastening mechanism is provided which guarantees that the plug fingers are precisely aligned with the block openings and the lever can be turned to accurately push the plug fingers into the block. The construction of the test plug is such that the plug is as light as possible and as solid and robust as possible to endure a high number of plug-in mounts.

Electromechanical or electronic devices such as relays and reclosers are typically installed in substation facilities and connect to medium to high voltage power lines via so-called monitoring circuits. The purpose of said devices is to monitor the operational power grid, e.g. protect grid sections from faults or record in-situ values at specific grid locations. The proper operation of said devices needs to be verified frequently over their entire lifetime. To this end, functional tests are undertaken at regular time intervals which indicate whether there is a defectiveness in any of their built-in functions. To facilitate an efficient testing process, it is common practice to use permanently installed test interfaces which are integrated into the monitoring circuits. Said test interfaces both provide a simple and safe disconnect functionality for any connected device.

The invention provides multiple improvements over the inventions described in U.S. Pat. Nos. 8,031,487 and 8,461,856 co-owned by Applicant, both of which are incorporated in their entirety by this reference.

BRIEF SUMMARY OF THE INVENTION

The invention relates to an interface test device for testing a circuit, the interface test device including a module assembly including a plurality of modules, each module configured to open and close at least one medium to high voltage monitoring circuit and the module assembly including a test block assembly and a test plug assembly, each module having at least one pair of contacts biased towards each other that are electrically connected and in line with the medium to high voltage monitoring circuit; and a test circuit, wherein the test circuit is connected to the medium to high voltage monitoring circuit before or substantially simultaneously with the medium to high voltage monitoring circuit being opened, wherein, each module is configured to provide at least one output based upon at least one parameter of the medium to high voltage monitoring circuit to the test circuit in order to measure the at least one parameter by an external tester connected to the test circuit, and wherein the test block assembly is formed from individual test blocks that are arranged at one another in parallel and fixated at one another, wherein the test plug assembly is formed from individual test plugs that are arranged at each other in parallel and fixated at each other, wherein the test plug assembly is movably supported between two side pieces attached at the test block assembly and respectively including guide slots for pinions of the test plug assembly, wherein the side pieces are removably attached at a front face of the test block assembly, wherein a lever arm is pivotably attached at the two side pieces, wherein two strut elements are pivotably attached at the lever arm and pivotably attached at the pinions of the test plug assembly at opposite sides of the test plug assembly, wherein a movement of the lever arm out of a plane of an insertion direction of the test plug assembly into the test block assembly is transferred by the strut elements to the to the pinions of the test plug assembly and inserts test fingers of the test plug assembly into openings of the test block assembly, wherein one of the test fingers of the test plug assembly opens the medium to high voltage monitoring circuit.

One embodiment of the test interface includes an assembly of a test block and a test plug with an identical electrical configuration. Upon insertion, the test plug opens up the monitoring circuits within the test block. Depending on the functionality of the connected device, such an interface can have many poles. A high number of poles can make it inherently challenging to manually insert the plug due to the aggregate weight of the plug and the aggregate friction during the insertion process. To alleviate such problems, the current invention provides a leverage mechanism which is incorporated into the plug and renders possible a particularly smooth insertion of easy motion.

The invention relates in particular to a test interface built into the monitoring circuits for medium to high voltage power lines. The test interface includes a test plug which can be inserted into a test block when put into operation. Both the test plug and the test block are made up of multiple modules which correspond to individual poles in the monitoring circuits. After the insertion of the plug, the monitoring circuits are interrupted between the connected device and the system lines. Then a test set can be wired to the device and testing can begin.

To facilitate a particularly smooth insertion process and ease of motion, the test plug assembly includes a lever mechanism. A lever is pivotably arranged at side elements of the plug assembly to that pivoting the lever pushes the plug fingers back and forth. Thus, the lever principle is applied to reduce a manual force needed for inserting the test plug assembly into the test plug assembly.

To ensure an accurate fit of the plug fingers into the designated openings of the block, the test plug is hooked into a fastener on the block, before the lever is turned for the insertion. When the plug is properly hooked into the block, it is guaranteed that the plug fingers are precisely aligned with the block openings and the lever can be turned to accurately push the plug fingers into the block.

The leverage mechanism facilitates inserting the test plug into the test block with as little force as possible. Additionally, the plug is designed to be as light as possible in order to make it preferably easy to carry it around or hold it in front of the test block.

BRIEF DESCRIPTION OF THE DRAWINGS

The invention is now described in more detail based on an advantageous embodiment with reference to drawing figures, wherein.

DETAILED DESCRIPTION OF THE INVENTION

Monitoring of interface test devices for medium to high voltage circuits and systems according to an exemplary embodiment of the invention may be implemented in an automated manner to provide for more continuous and comprehensive monitoring, greater efficiency and safety, reduced costs associated with the monitoring, as well as other advantages. Furthermore, the circuitry used in monitoring and control of an interface test device also may be configured such that maintenance on the medium to high voltage monitoring circuit is able to be performed safely and efficiently without taking the medium to high voltage monitoring circuit off line. With such monitoring circuitry incorporated into the medium to high voltage monitoring circuit, disruptive maintenance may be avoided because the medium to high voltage monitoring circuit does not need to be taken off line during testing and servicing of the medium to high voltage monitoring circuitry which means the servicing is performed without interrupting the medium to high voltage monitoring circuit. This improves efficiency and eliminates the problems that would otherwise be caused by these service interruptions.

The interface test device according to an embodiment of the invention also may be implemented such that when a test plug (either one that is inserted into an aperture of the interface module or one that is integrally formed with the interface module) opens the medium to high voltage monitoring circuit, the medium to high voltage monitoring circuit is protected. For example, when a medium to high voltage monitoring circuit is coupled to a power circuit through a transformer with one coil in the power circuit and the other coil in the medium to high voltage monitoring circuit, the medium to high voltage monitoring circuit cannot be opened without the risk of damaging the coil disposed therein. In order to open the medium to high voltage monitoring circuit for maintenance, the power circuit would have to be shut down because otherwise the primary transformer coil in the power circuit will attempt to continue driving current across the effectively infinite impedance of the secondary transformer coil and will produce high voltage across the open secondary transformer coil that can damage components and endanger operators. To avoid such problems, the test plug may be configured to make another circuit before the medium to high voltage circuit is opened. Such a system may be implemented with an automated monitoring system for the interface module or may be implemented with a monitoring system for the interface module that is not automated. Similarly, other elements including potential transformers and breakers also are protected.

Figure 1:
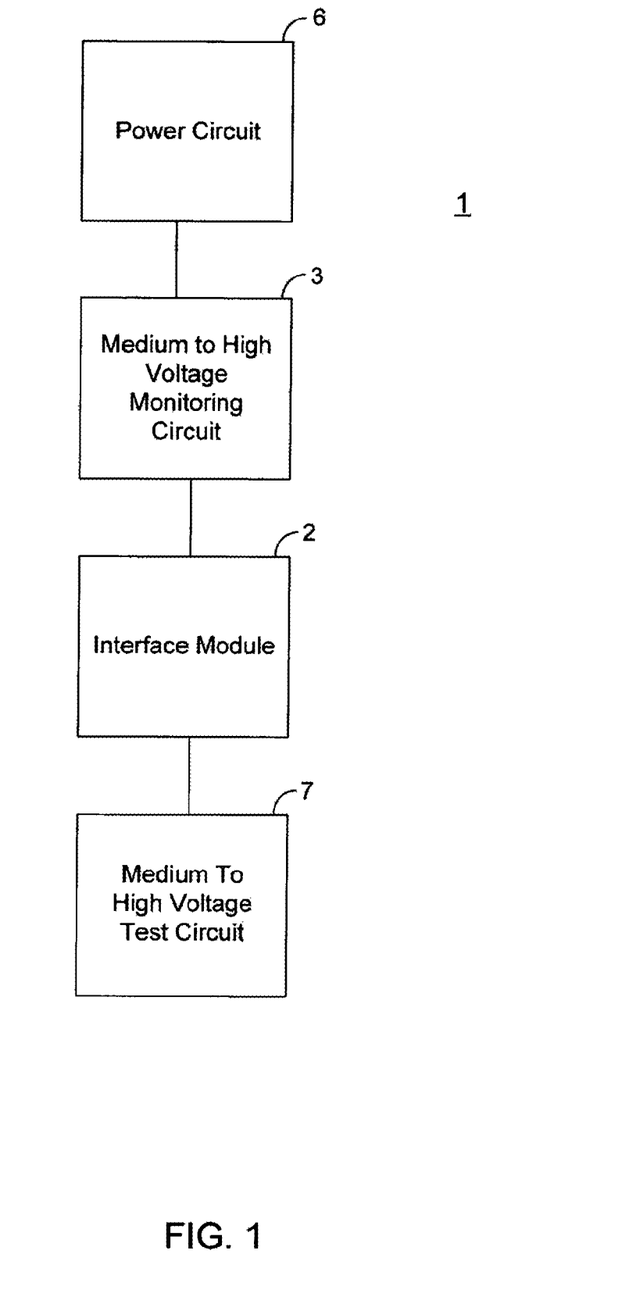
FIG. 1 illustrates a block diagram of an exemplary interface test device according to an embodiment of the invention.

FIG. 1 shows a block diagram of an exemplary interface test device 1 according to an embodiment of the invention. The interface test device 1 includes a power circuit 6 monitored by a medium to high voltage monitoring circuit 3, an interface module 2 to connect the medium to high voltage monitoring circuit 3 to a test circuit 7. The test circuit 7 is also known as an external tester.

Figure 2:
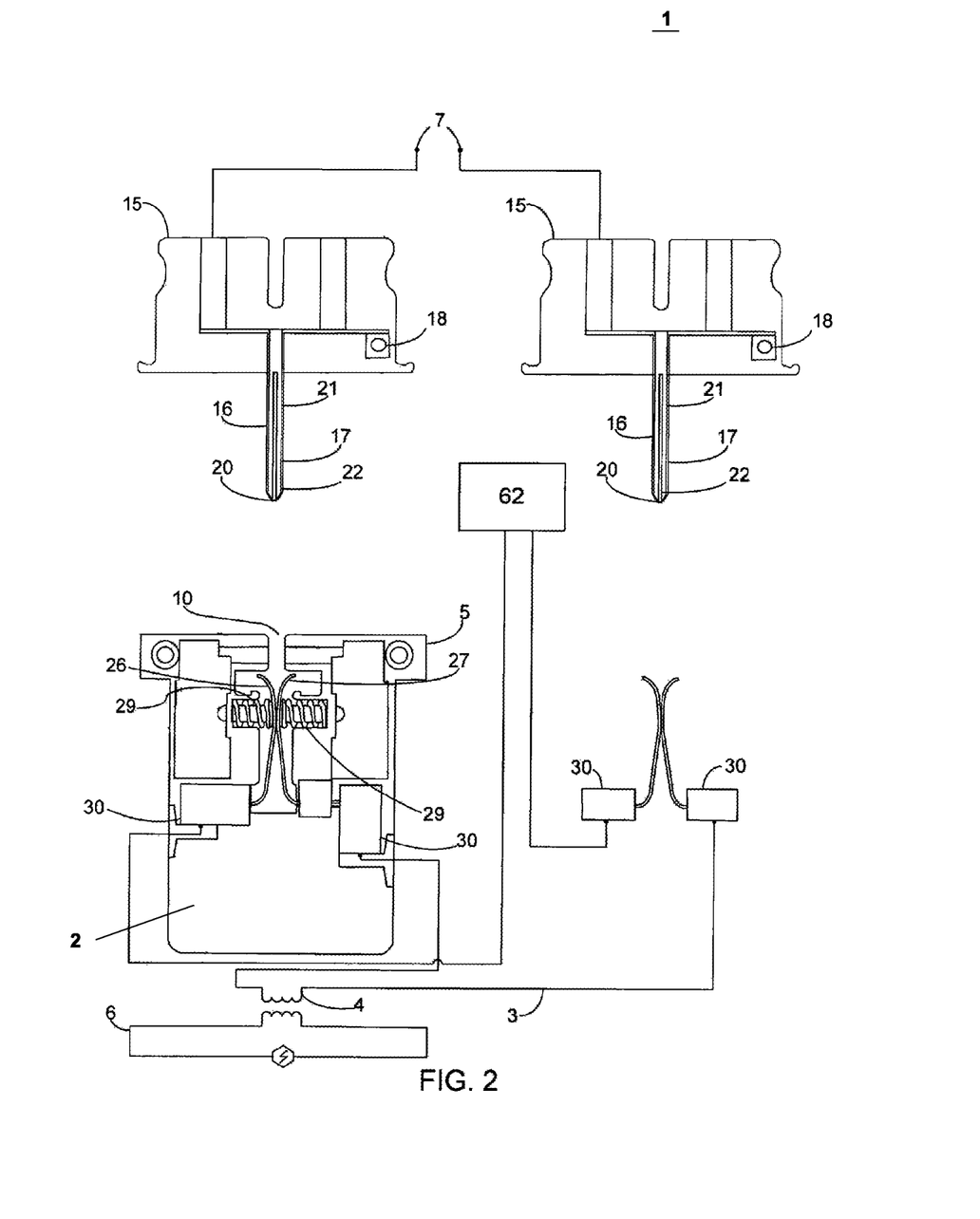
FIG. 2 illustrates an embodiment of the interface test device including two interface modules, each interface module with a test plug and a test block where the test plug is not inserted into the test block.

FIG. 2 illustrates an embodiment of the interface test device 1 including an interface module 2 with two test plugs 15 (also known as test paddles) and two test blocks 5 (also known as test switches or disconnect devices) where the test plugs 15 are not inserted into the test blocks 5. The interface test device 1 of FIG. 2 includes a medium to high voltage monitoring circuit 3, a monitoring component 4, a power circuit 6, a test circuit 7, an aperture 10, two test plug B-side contacts 16, two test plug A-side contacts 17 (test plug B-side contact 16 and test plug A-side contact 17 are collectively referred to as a pair of test plug contacts 16, 17), two shorting bars 18, two fingers 20, two insulators 21, two keying features 22, two test block B-side biased contacts 26, two test block A-side biased contacts 27 (test block B-side biased contact 26 and test block A-side biased contact 27 are collectively referred to as a pair of biased contacts 26, 27 and may be formed from a high-quality silver-plated copper contacts, high-quality gold plated copper contacts or any other suitable material or materials), biasing springs 29, terminals 30, and a piece of equipment 62 (e.g. a relay to be tested). The two test blocks are used in series. The second test block, which is only partially shown on the right side of FIG. 2 is configured identical to the fully shown test block.

The first and the second test plugs, which are only partially shown on the right side of FIG. 2 and which are identical to the fully illustrated test plug, can be used to isolate and test the piece of equipment 62. The test plugs 15 may be shaped such that only suitable test plugs 15 will mate with the test blocks 5 via apertures 10 with an optional keying feature 22 on fingers 21. This keying feature 22 prevents inadvertent insertion of unsuitable test plugs that can damage the interface module 2 or other devices and harm the person inserting the unsuitable test plug. Suitable test plugs 15 break the medium to high voltage monitoring circuit 3 and connect the test circuit 7 with the medium to high voltage monitoring circuit 3 substantially simultaneously. This prevents the medium to high voltage monitoring circuit 3 from ever being interrupted and thus prevents any of the problems that would otherwise result from such an interruption. The test plugs 15 can be inserted into the test blocks 5 for testing potential, current, and signal disconnect links, thereby providing electrical access to all poles on both sides of the test block 5. The simple, safe, and efficient design of the interface test device provides access to in-service currents without interrupting the current path prior or during test plug insertion.

Additionally, the keying feature 22 assures the various contacts are properly matched such that the test block B-side biased contact 26 is connected to the test plug B-side contact 16 and the test block A-side biased contact 27 is connected to the test plug A-side contact 17. The insulator 21 is disposed between the test plug B-side contact 16 and the test plug A-side contact 17. In other words, the finger 20 includes a keying feature 22 that engages the aperture 10 of the test block 5 such that the finger 20 can only be inserted into the aperture 10 in one orientation and the test plug B-side contact 16 of the test plug 15 connects to the test block B-side biased contact 26 of the test block 5 and the test plug A-side contact 17 of the test plug 15 connects to the test block A-side biased contact 27 of the test block 5 such that a connection with the correct polarity is assured.

The medium to high voltage monitoring circuit 3 is coupled to the power circuit 6 through a monitoring component 4. The pairs of biased contacts 26, 27 are connected to the medium to high voltage monitoring circuit 3 through terminals 30. The test plug 15 includes a finger 21 supporting the pair of test plug contacts 16, 17 configured to connect to the pair of biased contacts 26, 27 of the medium to high voltage monitoring circuit 3. The pair of test plug contacts 16, 17 are connected to the test circuit 7, for testing the medium to high voltage monitoring circuit 3 including the monitoring component 4 and the piece of equipment 62. The test block 5 and the test plug 15 including the finger 21 may be formed from impact resistant insulator material, such as a plastic (e.g. polypropylene or polyethylene) or any other suitable material that will mechanically support and insulate components of the medium to high voltage monitoring circuit 3 and of the test circuit 7. The materials of the test block 5 may be clear so as to assist in maintenance, detection or sabotage or the like or may be opaque.

The medium to high voltage monitoring circuit 3 operates a monitoring component 4, such as a secondary coil of a transformer, which is used for monitoring a power circuit 6 with the primary coil disposed in the power circuit 6 and the secondary coil disposed in the medium to high voltage monitoring circuit 3 and couples the medium to high voltage monitoring circuit 3 to the power circuit 6. This protects the monitoring and control components 4 from damage because the higher voltages and/or currents in the power circuit 6 would damage or destroy the monitoring and control components 4 in the medium to high voltage monitoring circuit 3 if directly applied. For example, a current transformer may be used to monitor the power circuit 6 when the current and/or voltage in the power circuit 6 is too high to directly apply to measuring instruments in the medium to high voltage monitoring circuit 3 or in the test circuit 7. A current transformer and/or other elements may be used to produce a reduced current that is accurately proportional to the current in the power circuit 6 that can be conveniently connected to measuring and recording instruments in the medium to high voltage monitoring circuit 3 and in the test circuit 7. For example, the secondary winding of a current transformer should not be disconnected from its load while current is flowing in the primary winding in the power circuit 6, as the current transformer will attempt to continue driving current across the effectively infinite impedance and produce a very high voltage (into the range of several kilovolts in some cases) in the secondary current transformer coil that can permanently damage the current transformer such that either the current transformer no longer functions or is no longer an accurate indicator for the power circuit 6, and the very high voltage can compromise operator and equipment safety.

The test block 5 includes an aperture 10 configured to receive a finger 20 of the test plug 15. The test block 5 also houses a pair of biased contacts 26, 27 that act as disconnect links that normally connect the medium to high voltage monitoring circuit 3 to external terminals 30.

The terminals 30 may be made of conductive metal material such as brass, copper or any other suitable material. The terminals 30 may be configured to receive standard connectors or other connectors. The finger 20 may be made of impact resistant insulator material such as polypropylene, polyethylene or any other suitable material, and the finger may be configured to insulate against the voltages of the medium to high voltage monitoring circuit 3. As illustrated in FIG. 2, the pair of biased contacts 26, 27 in the test block 5 are in the closed position. In the closed position, the pair of biased contacts 26, 27 are securely pressed together by their own tension and may be additionally pressed together by one or two biasing springs 29 acting substantially against the opening direction of the pair of biased contacts 26, 27 and exerting force from one or both sides to create a constant contact pressure that minimizes internal resistance. The pair of biased contacts 26, 27 may be spread apart and disconnected from one another by insertion of the finger 20 of the test plug 15 between the pair of biased contacts 26, 27.

Figure 3:
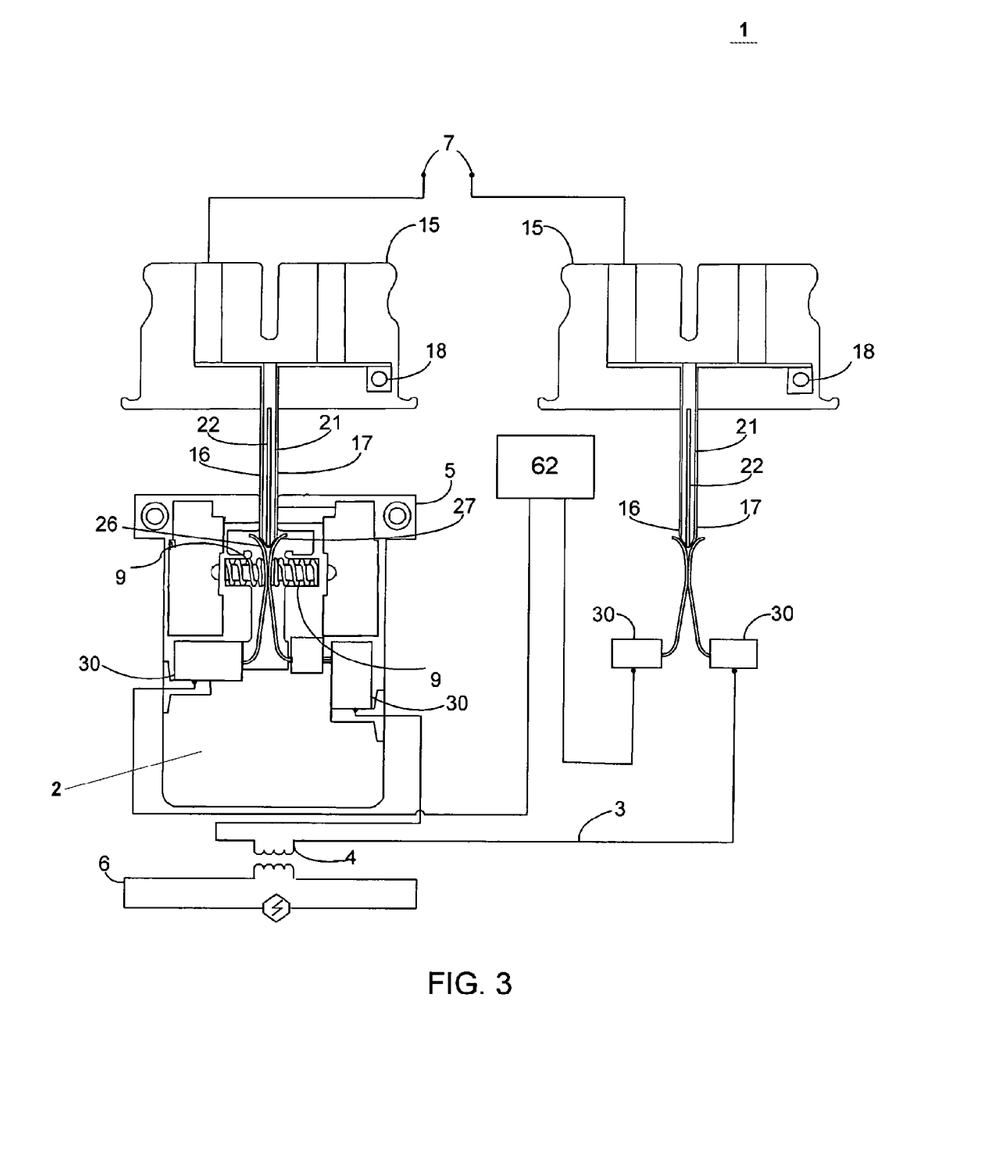
FIG. 3 illustrates an embodiment of the interface test device where the test plugs are partially inserted into the test blocks.

FIG. 3 illustrates an embodiment of the interface test device 1 where the test plugs 15 are partially inserted into the test blocks 5. Specifically, the test plugs 15 have been inserted into apertures 10 of the test blocks 5 where the pair of test plug contacts 16, 17 contact the pair of biased contacts 26, 27 but do not cause the pair of biased contacts 26, 27 to separate. The pair of test plug contacts 16, 17 being in contact with the pair of biased contacts 26, 27 ground the medium to high voltage monitoring circuit 3 through the test plug A-side contacts 17 of the test plugs 15 and the shorting bars 18, which act as a safety precaution to protect the monitoring circuit 3 and the test circuit 7 and helps to prevent an electric arc from forming when the pair of biased contacts 26, 27 are opened.

Figure 4:
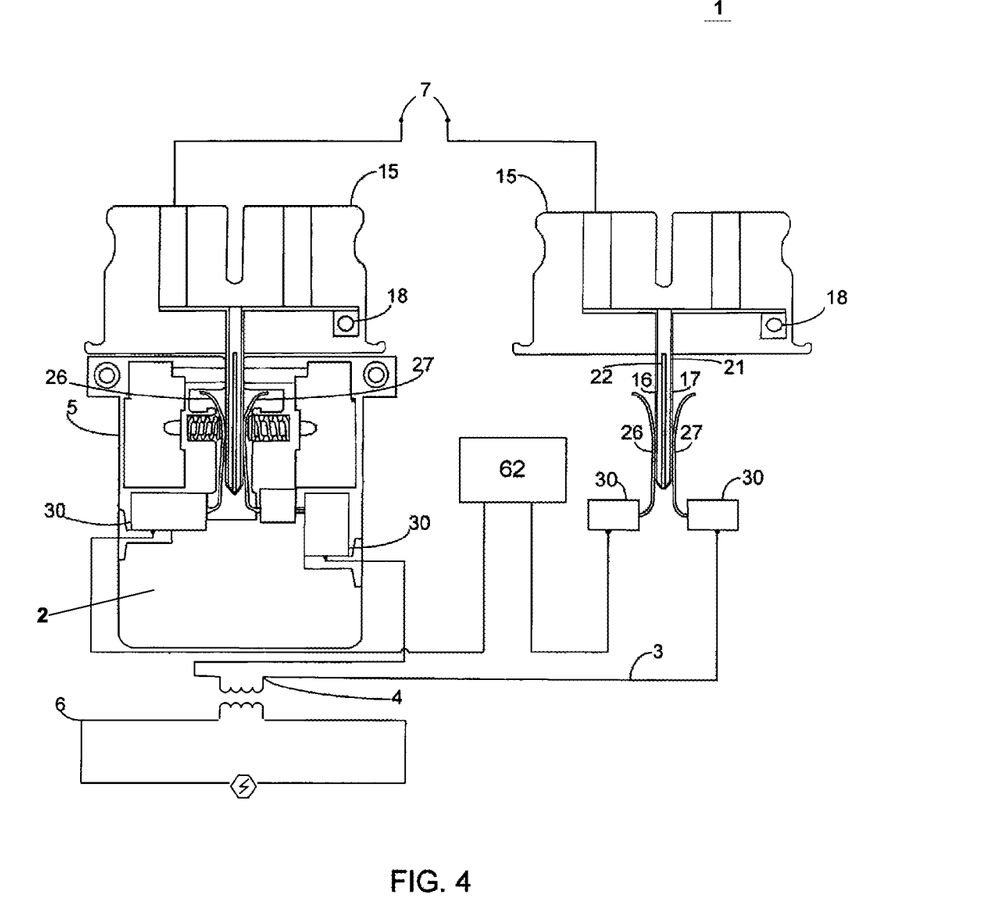
FIG. 4 illustrates the interface test device where the test plugs are fully inserted into the test blocks.

FIG. 4 illustrates the interface module 2 of FIG. 1 with the test plugs 15 fully inserted into the test blocks 5. The test plug A-side contact 16 connects to the test block A-side biased contact 26 and the test plug B-side contact 17 connects to the test block B-side biased contact 27 of the medium to high voltage circuit 3 and the pair of biased contacts 26, 27 are separated. This means that the test block B-side biased contacts 27 are connected to the test plug B-side contact 17 and thus are grounded by the shorting bar 18 and thus may be used for testing.

Insertion of the test plug 15 farther into the test block 5 as illustrated in FIG. 4 pushes the finger 20 between the pair of biased contacts 26, 27 and separates the pair of biased contacts 26, 27 from each other causing the opening of the medium to high voltage monitoring circuit 3 and thereby connecting to the test circuit 7 and simultaneously isolating the device to be tested in the same motion. The insertion of the finger 20 between the pair of biased contacts 26, 27 occurs against the natural direction of the electric arc opening between the pair of biased contacts 26, 27 and inserts an insulator 21 between the two poles of the pair of biased contacts 26, 27 which guarantees that no electric arc occurs while the pair of biased contacts 26, 27 is being opened. The interface test device 1 is designed to perform a "make-before-break" function, where make means shorting the current transformer ends. This "make-before-break" function provides superior protection for current transformers and other circuit elements. For example, upon insertion of the test plug 15, the pair of biased contacts 26, 27 is automatically short-circuited by the shorting bar 18 along pre-assigned poles, in a single step. The simple, safe, and efficient design of the test plug 15 and the test block 5 provides access to in-service medium to high voltage monitoring and control components 4 and the equipment 62 without interrupting the current path prior or during test plug 15 insertion. The interface test device 1 utilizes "make-before-break" function to maintain electrical system continuity and automatically short circuit medium to high voltage component current channels before opening the medium to high voltage monitoring and control circuit 3. Potential and signal links are disconnected by the test plug 15 with high quality electrical insulation. The single movement of test plug 15 insertion both "makes" and "breaks" the medium to high voltage circuit 3 in a fail-safe sequence that achieves proper isolation and restoration every time. With the test plug 5 inserted as illustrated in FIG. 4, testing and replacement of a defective medium to high voltage monitoring component 4 and of the equipment 62 can be safely performed.

The pair of biased contacts 26, 27 automatically closes upon removal of the test plug 15. For example, the biasing springs 29 that press the pair of biased contacts 26, 27 towards each other guarantee that the medium to high voltage monitoring circuit 3 is closed when the testing procedures are finished.

The use of multiple test plugs 15 allows for the testing of portions of the test circuit 7. Alternatively, if the entire test circuit is to be tested, a single test plug may be used.

Figure 5:
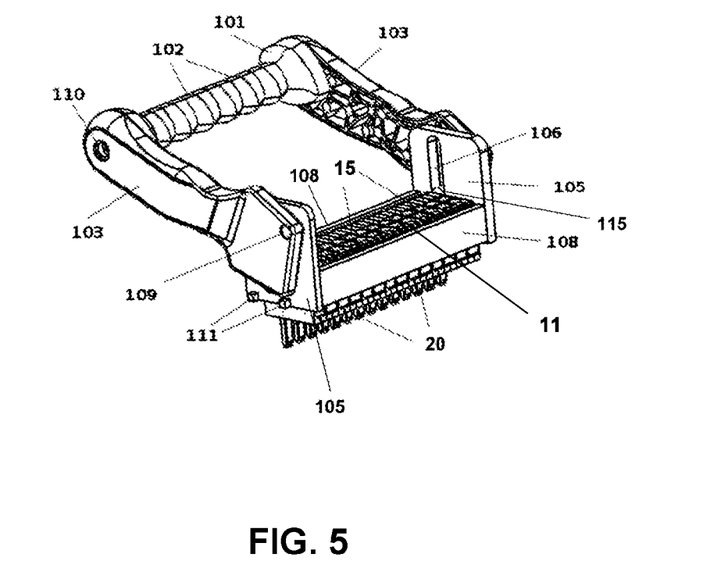
FIG. 5 illustrates a perspective side view of a test plug assembly with its lever tilted and the plug fingers pushed out.

FIG. 5 illustrates a test plug assembly 11 and an insertion lever 101,102,103 for the test plug assembly tilted down and test plug fingers 20 of test plugs 15 pushed down. The test plug assembly 11 includes multiple test plugs 15 arranged and attached at each other in parallel and enclosed by two frame rails 108. The lever includes two arm pieces 103 on each side which are rotatable about pivot points 109 which define a pivot axis of the lever. A handle 101-102 of the lever includes multiple centerpieces 101, 102 aligned on a through bolt 110. Load transfer from the lever arm pieces 103 onto outermost test plugs 15 of the test plug assembly 11 is facilitated by two lateral strut elements 104 (designated in FIG. 7) which are pivotably connected at the lever arm pieces 103 and pivotably connected at pinions 115 of the outermost test plugs 15 of the plug assembly.

The pinions 115 provide sliding support for the plug assembly 11 in guide rails 106 provided in both terminal plates 105. In the illustrated position, the test plug assembly 11 is pushed down in a direction towards a test block assembly 14 and plug fingers 20 of the test plug assembly 11 stick out of the plug assembly frame formed by the terminal plates 105 and the frame rails 108. This would correspond to an inserted condition of the plug assembly, if the test plug assembly were fastened to the test block assembly. On each, outside flank of the terminal plates 105 there are two protrusions 111 that are used for locking the terminal plates 105 of the plug assembly to side pieces 201 that are bolted to the test block assembly 14.

Figure 6:
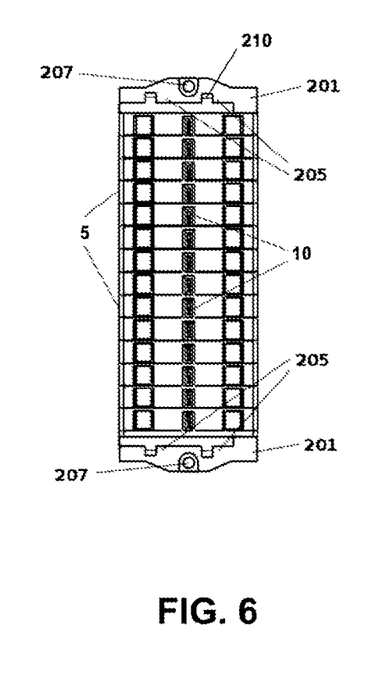
FIG. 6 illustrates a view of a front face of a test block assembly according to the invention showing insertion openings for the test plug fingers.

FIG. 6 illustrates a face view of the test block assembly, e.g., it shows its front onto which the test plug assembly will be connected. The test blocks 5 are enclosed by two side pieces 201. The side pieces 201 respectively include a screw hole 207 for bolting the test plug assembly to the test block assembly and small guide rails 205 for the protrusions 111 of the terminal plates 105 of the test plug assembly. Each of the guide rails 205 receives a protrusion 111 of a terminal plate 105. The guide rails 205 include snap locks 210 to lock the terminal plates 105 in place in the side pieces 201. After the protrusions 111 are inserted into the guide rails 205 and snap locked at a bottom of the guide rail 205 the test plug assembly 11 is in a position suitable for the insertion of the test plug fingers 20 into the test blocks 5. All the test blocks 5 have openings 10 in their centers to receive the test plug fingers 20.

Figure 7:
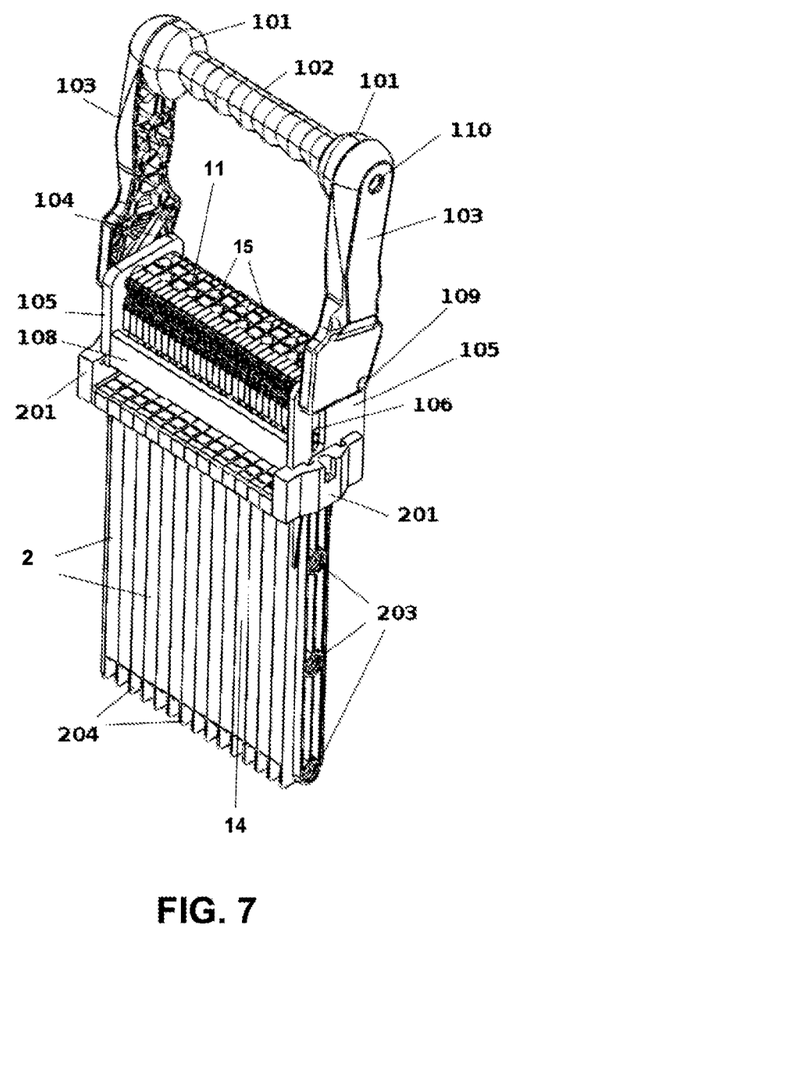
FIG. 7 illustrates the test interface assembly according to the invention with the test plug assembly fastened to the test block assembly, the lever straight and the test plug fingers not yet inserted into the test blocks.

FIG. 7 illustrates the test interface with the test plug assembly 11 fastened to the test block assembly 14 with the test plug fingers 20 not yet inserted into the test blocks 5. In this position, the lateral strut element 104 is visible which provides a force transfer from the lever arm pieces 103 of the lever onto the pinions 115 (designated in FIG. 5) of the test plug assembly 11. The test block assembly 14 includes multiple test blocks 5 which extend from one end with the openings 10 for the plug fingers 20 (designated in FIG. 5) to the other end with the wire connections 204. The test blocks 5 are pulled together by parallel bolts 203 which penetrate the test blocks 5 from the first test block 5 to the last test block 5. The front side of the test block with the openings 10 for the plug fingers 20 is enclosed by two side pieces 201. The side pieces 201 include the guide rails 205 including the snap locks 210 (designated in FIG. 6) for attaching the terminal plates 105 at the test block assembly 11. Each of the guide rails 205 supports a protrusion 111 of the terminal plates 105 that include the guide rails 106 for guiding an insertion movement of the test plug assembly 11 into the test block assembly 14.

Figure 8:
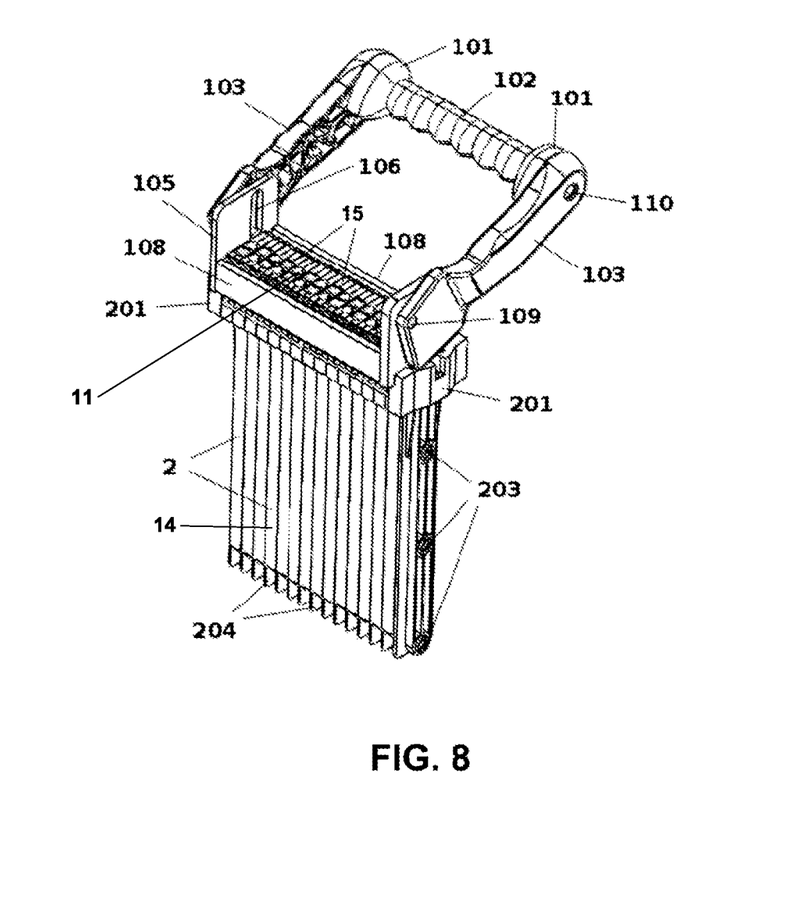
FIG. 8 illustrates the test interface assembly according to the invention with the test plug assembly fastened to the test block assembly, the lever angled and the test plug fingers inserted into the test blocks.

FIG. 8 illustrates the test interface according to the invention with the test plug assembly 11 fastened to the test block assembly 14 and the test plug fingers 20 inserted into the test blocks 5. Unlike from the condition illustrated in FIG. 3, the handle is no longer aligned with the longitudinal axis of the test blocks and an insertion direction of the test plug fingers 20 into the test blocks but arranged at an angle relative to the longitudinal axis of the test blocks and the insertion direction of the test plug fingers. The test plug assembly has been pushed to a bottom end of the guide rails 106 in the terminal plates 105 and the test plug fingers 20 are pushed into the openings 10 of the test blocks 5 and inserted into the test blocks 5 so that the contacts 26, 27 are opened. The angled position of the test plug lever arms 103 corresponds to the position shown in FIG. 3.

The present invention relates to a test interface built into the monitoring circuits for medium to high voltage power lines. It includes a test plug which can be inserted into a test block when put into operation. Both the test plug assembly 11 and the test block assembly 14 are made up of multiple test plugs 15 and test blocks 5 which correspond to individual poles in the monitoring circuits. After insertion of the test plugs 15 into the test blocks 5, the monitoring circuits are interrupted between the connected device and the system lines. The test plug fingers 20 then separate a pair of converging contact springs 26, 27 which are arranged below each opening 10 in the test blocks. Then simulated currents and voltages can be infected on the device side via banana jacks on the plug and testing of the device can be initiated.

To facilitate particularly smooth insertion and ease of motion, the test plug assembly 11 is moved relative to the test block assembly 14 by a lever mechanism. The lever handle is 101-102 is assembled by a through bolt 110 and can be and can be pivoted around the pivot axis defined by the pivot pints 109 to move the plug fingers 20 back and forth. Thus, a lever principle is applied to reduce a manual force required for inserting the plug fingers 20 in the test blocks 5. The lever arms 103 move two lateral strut elements 104 which are pivotably connected to both pinions 115 (designated in FIG. 5) of the test plug assembly and both lever arms 103. The pinions 115 are guided in the guide rails 106 provided in the terminal plates 105 and provide the load transfer to move the plug fingers 20 back and forth. Since the guide 106 rails are centered relative to a plane that includes the centers of the plug fingers 20 and that is aligned parallel to a vertical extension of the test block arrangement 11 and an orientation of the plug fingers 20, an activation of the lever arms 103 pushes the plug fingers 20 straight into the test blocks 5 and does not misalign the plug fingers 20 relative to the test blocks 5. A force applied to push the test plug fingers 20 into the test blocks 5 is evenly distributed over all individual plug fingers, since the force transfer from the handle 101-102 is split up into two equal portions at the two pinions 115. The configuration of the plug assembly promotes straight insertion of the plug fingers 20 into the test blocks 5 and avoids potential friction originating from a misalignment of the plug fingers 20 relative to the test blocks 5.

To ensure an accurate fit of the plug fingers 20 into designated openings 10 of the test block assembly, the test plug assembly is attached to two side pieces 201 bolted to the test block assembly before the lever arms 103 are turned for the insertion of the test plugs 15 in the test blocks 5. The two side pieces 201 each include short guide rails 205 on both sides of the test block assembly 11. Each guide rail 205 is configured to receive a protrusion 111 which is laterally provided at the side plates 105. The protrusions 111 are insertable through a rectangular cavity into each guide rail 205. The surface of each guide rail 205 is smooth enough for the inserted protrusion to slide inward until it reaches a designated stop and is locked in place by the snap locking arrester 210 (designated in FIG. 6). In this position, it is guaranteed that the plug fingers 20 are correctly aligned with the openings 10 of the test block 5 and the lever arms 103 can be rotated to accurately push the plug fingers 20 into the test blocks 5.

The leverage mechanism aids in manually inserting the test plug into the test block with as little force as possible. The test plug assembly 11 is designed to be as light as possible in order to make it easy to carry or hold in front of the test block assembly 14. This way the plug becomes particularly handy which additionally promotes an easy insertion process. A light weight of the plug is achieved by its construction type with strutted pieces where possible.

The test plug arrangement includes three joints: one in the lever's swivel points 109 and two at each end of the lateral strut elements 104. These joints are linked by custom-made rivets which are specifically designed to be sufficiently robust with respect to mechanical impacts and to endure a high number of load cycles.

Although several embodiments of the present invention and its advantages have been described in detail, it should be understood that changes, substitutions, transformations, modifications, variations, permutations and alterations may be made therein without departing from the teachings of the present invention, the spirit and the scope of the invention being set forth by the appended claims.

REFERENCE NUMERALS AND DESIGNATIONS 1 interface test device
2 interface module
3 medium to high voltage monitoring circuit
4 monitoring component
5 test block
6 power circuit
7 test circuit
10 test block opening
11 test plug assembly
14 test block assembly
15 test plug
17 disconnect plug A-side contact
18 shorting bar
19 cover plate
20 test plug finger
21 insulator 22 keying feature
26 A-side biased contact spring
27 B-side biased contact spring
29 compression spring
30 terminal block
62 equipment to be tested
101 handle center piece
102 handle center piece
103 lever arm piece
104 strut element
105 terminal plate
108 frame rail
109 pivot point
110 through bolt
111 protrusion of terminal plate
115 test plug pinion
201 side piece
203 bolt
204 wire connection
205 guide rail
206 stud connector
207 screw hole
210 snap lock

What is claimed is:

1. An interface test device for testing a circuit, the interface test device comprising:
    a module assembly including a plurality of modules, each module configured to open and close at least one medium to high voltage monitoring circuit and the module assembly including a test block assembly and a test plug assembly,
    at least one pair of contacts biased towards each other that are electrically connected and in line with the at least one medium to high voltage monitoring circuit for each module; and
    a test circuit,
    wherein the test circuit is connected to the at least one medium to high voltage monitoring circuit before or substantially simultaneously with the at least one medium to high voltage monitoring circuit being opened,
    wherein each module is configured to provide at least one output based upon at least one parameter of the at least one medium to high voltage monitoring circuit to the test circuit in order to measure the at least one parameter by an external tester connected to the test circuit,
    wherein the test block assembly is formed from individual test blocks that are arranged at one another in parallel and fixated at one another,
    wherein the test plug assembly is formed from individual test plugs that are arranged at one another in parallel and fixated at one another,
    wherein the test plug assembly is movably supported between two side pieces attached at the test block assembly and respectively including guide rails for pinions of the test plug assembly,
    wherein the side pieces are removably attached at a front face of the test block assembly,
    wherein a lever arm is pivotably attached at the two side pieces,
    wherein two strut elements are pivotably attached at the lever arm and pivotably attached at the pinions of the test plug assembly at opposite sides of the test plug assembly,
    wherein a movement of the lever arm out of a plane of an insertion direction of the test plug assembly into the test block assembly is transferred by the strut elements to the pinions of the test plug assembly and inserts test fingers of the test plug assembly into openings of the test block assembly, and
    wherein one of the test fingers of the test plug assembly opens the at least one medium to high voltage monitoring circuit.

2. The device of claim 1, wherein the at least one medium to high voltage monitoring circuit may be serviced for maintenance without being interrupted.

3. The device according to claim 1, wherein the side pieces are snap locked at the test block assembly.

4. The device according to claim 1, wherein a force is transferred from the lever to the test plug assembly which force is oriented parallel to an insertion direction of the fingers of the test plugs into the openings of the test block assembly.

5. The device according to claim 1 wherein the test fingers of the test plugs of the test plug assembly are precisely aligned with insertion openings of the test blocks of the test block assembly.

6. The device according to claim 1, wherein the force is evenly distributed to all test fingers of the test plug assembly.

* * * * *